US009405201B2

(12) United States Patent
Chang

(10) Patent No.: US 9,405,201 B2
(45) Date of Patent: Aug. 2, 2016

(54) LITHOGRAPHY PROCESS USING DIRECTED SELF ASSEMBLY

(71) Applicant: Taiwan Semiconductor Manufacturing Company, Ltd., Hsin-Chu (TW)

(72) Inventor: Yu-Sheng Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/550,207

(22) Filed: Nov. 21, 2014

(65) Prior Publication Data
US 2015/0076108 A1 Mar. 19, 2015

Related U.S. Application Data

(63) Continuation-in-part of application No. 13/675,706, filed on Nov. 13, 2012, now Pat. No. 8,894,869.

(51) Int. Cl.
| B44C 1/22 | (2006.01) |
| C03C 15/00 | (2006.01) |
| C03C 25/68 | (2006.01) |
| C23F 1/00 | (2006.01) |
| G03F 7/40 | (2006.01) |
| H01L 21/027 | (2006.01) |
| H01L 21/033 | (2006.01) |
| G03F 7/00 | (2006.01) |

(52) U.S. Cl.
CPC ............... *G03F 7/40* (2013.01); *G03F 7/0002* (2013.01); *H01L 21/0271* (2013.01); *H01L 21/0337* (2013.01)

(58) Field of Classification Search
CPC ................................. G03F 7/40; G03F 7/0002
USPC ....................................................... 216/49, 41
See application file for complete search history.

(56) References Cited

U.S. PATENT DOCUMENTS

| 7,300,883 | B2 | 11/2007 | Celii et al. | |
| 8,119,017 | B2 | 2/2012 | Albrecht et al. | |
| 2006/0046498 | A1 | 3/2006 | Celii et al. | |
| 2009/0092803 | A1 | 4/2009 | Bita et al. | |
| 2009/0093133 | A1* | 4/2009 | Doris et al. | 438/781 |
| 2010/0151393 | A1* | 6/2010 | Kim et al. | 430/322 |
| 2010/0167214 | A1* | 7/2010 | Yoon et al. | 430/323 |
| 2010/0190114 | A1 | 7/2010 | Sandhu et al. | |

FOREIGN PATENT DOCUMENTS

CN 101609691 12/2009

* cited by examiner

*Primary Examiner* — Roberts Culbert
(74) *Attorney, Agent, or Firm* — Slater Matsil, LLP

(57) ABSTRACT

A method includes forming a patterned hard mask layer, with a trench formed in the patterned hard mask layer, dispensing a Bulk Co-Polymer (BCP) coating in the trench, wherein the BCP coating comprises a mix of a first material and a second material different from the first material. The method further includes treating the BCP coating with a chemical to form a first plurality of strips of the first material and a second plurality of strips of the second material, with the first plurality of strips and the second plurality of strips allocated in an alternating layout. The second plurality of strips is selectively etched, and the first plurality of strips is left in the trench.

20 Claims, 9 Drawing Sheets

LITHOGRAPHY PROCESS USING DIRECTED SELF ASSEMBLY

PRIORITY CLAIM AND CROSS-REFERENCE

This application is a continuation-in-part application of the following commonly-assigned U.S. patent application: application Ser. No. 13/675,706, filed Nov. 13, 2012, and entitled "Lithography Process Using Directed Self Assembly;" which application is hereby incorporated herein by reference.

BACKGROUND

Directed Self Assembly (DSA) process is currently being developed for lithography processes. In conventional DSA processes, a photo resist is formed and patterned, followed by the dispensing of a Bulk Co-Polymer (BCP) coating. The BCP coating comprises Polystyrene (PS) and Polymethyl Methacrylate (PMMA). An anneal step is then performed to cause a phase separation in the BCP, so that the PS and PMMA are separated into parallel strips that are parallel to the edges of the photo resist. The PMMA strips are then etched, and the PS strips remain. The PS strips are used as an etching mask to etch an underlying layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
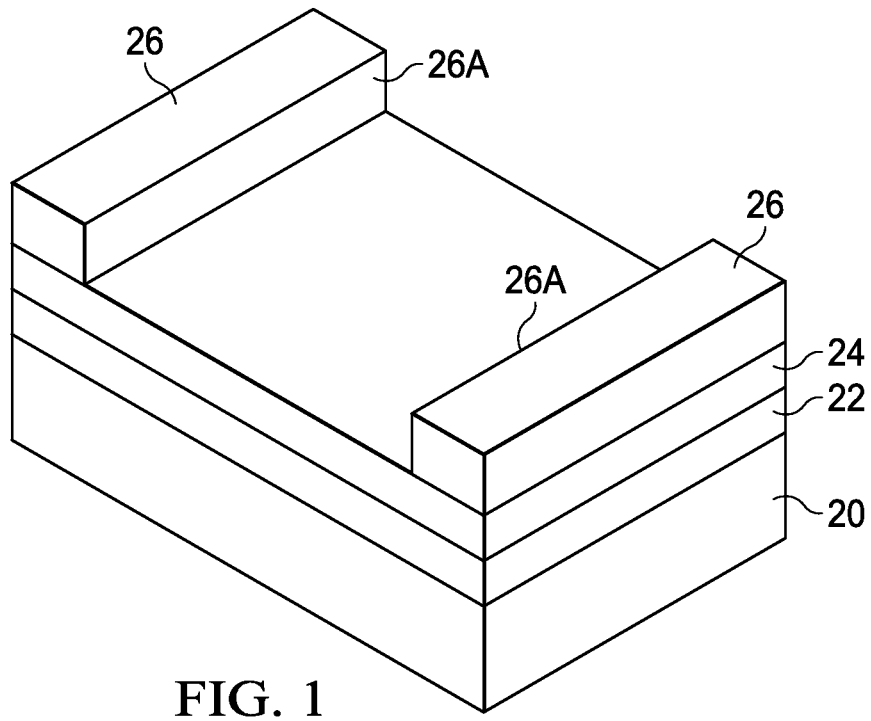
FIGS. 1 through 9 are cross-sectional views of intermediate stages in a Directed Self Assembly (DSA) process in accordance with some exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 18:
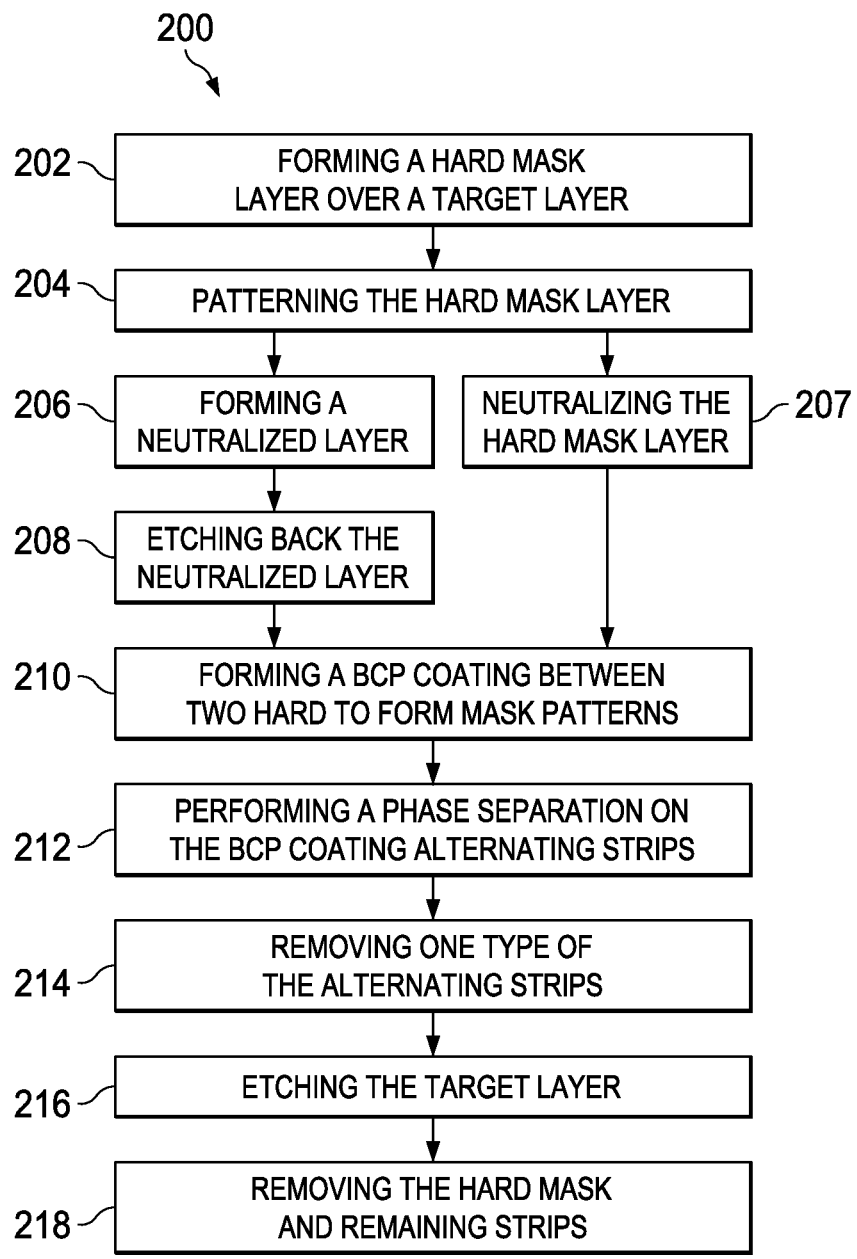
FIG. 18 illustrates a process flow of the DSA process in accordance with various embodiments.

A lithography process performed using a Directed Self Assembly (DSA) process is provided in accordance with various exemplary embodiments. The intermediate stages of the lithograph process are illustrated. The variations of the embodiments are discussed. Throughout the various views and illustrative embodiments, like reference numbers are used to designate like elements. The steps shown in FIGS. 1 through 17 are also illustrated schematically in the process flow 200 as shown in FIG. 18. In the subsequent discussion, the process steps shown in FIGS. 1 through 17 are discussed referring to the process steps in FIG. 18.

FIGS. 1 through 9 illustrate the top views and cross-sectional views of the lithography process in accordance with exemplary embodiments of the present disclosure. FIG. 1 illustrates target layer 20, which is to be patterned in the lithography process. Target layer 20 may be any layer that is to be patterned in the manufacturing of integrated circuits. In accordance with some embodiments of the present disclosure, target layer 20 is a semiconductor substrate on which integrated circuit devices are to be formed. For example, target layer 20 may be a silicon substrate, a silicon germanium substrate, a silicon carbon substrate, a III-V compound semiconductor substrate, or the like. Target layer 20 may also be a bulk semiconductor substrate, a semiconductor-on-insulator substrate, or a dielectric substrate. In alternative embodiments, target layer 20 is a metal layer such as an aluminum layer, an aluminum copper layer, a nickel layer, or a tungsten layer. In yet alternative embodiments, target layer 20 is a dielectric layer such as a low-k dielectric layer, an oxide layer, a nitride layer, or the like. In accordance with some embodiments of the present disclosure, there may be more regions and devices underlying or at the surface of target layer 20, which regions and devices are not illustrated for clarity.

In accordance with some embodiments of the present disclosure, hard mask layer 22 and Bottom Anti-Reflective Coating (BARC) 24 are formed over target layer 20. The respective step is shown as step 202 in the process flow shown in FIG. 18. The material of hard mask layer 22 is selected, so that hard mask layer 22 is able to sustain the temperature of the subsequent annealing of Bulk Co-Polymer (BCP) coating 32 (FIG. 5) without being deformed or damaged. In accordance with some embodiments, hard mask layer 22 is an inorganic layer, a non-photo-sensitive layer, or the like. For example, hard mask layer 22 may be formed of a nitride, an oxide, an oxynitride, a carbonitride, combinations thereof, or multi-layers thereof. In some exemplary embodiments, hard mask layer 22 comprises a silicon nitride layer. In alternative embodiments, hard mask layer 22 comprises a metal hard mask comprising titanium nitride, tantalum nitride, titanium, tantalum, boron nitride, combinations thereof, or multi-layers thereof. Hard mask layer 22 may be formed using a Chemical Vapor Deposition (CVD) method such as Plasma Enhanced CVD (PECVD), Atomic Layer Deposition (ALD), Metal-Organic CVD (MOCVD), or the like. The thickness of hard mask layer 22 may be between about 5 nm and about 100 nm, for example. It is appreciated, however, that the values recited throughout the description are merely examples, and may be changed to different values. For example, the thickness of hard mask layer 22 may be adjusted depending on the desirable thickness of the subsequently formed BCP coating 32 (FIG. 5), and the thickness of hard mask layer 22 is at least equal to, or greater than, the thickness of BCP coating 32.

BARC 24 may be formed of polymer, silicon oxynitride, or other applicable materials, and may be formed of spin on. BARC 24 has the function of reducing reflection in the light-exposure of the overlying photo sensitive layer 26, so that the patterns of photo sensitive layer 26 is not adversely affected by the reflection from the underlying layers such as hard mask layer 22. In alternative embodiments, BARC 24 may be omitted. In yet other embodiments, additional layers (not shown) such as a PE oxide, an amorphous carbon layer, a nitride layer, or the like, may be formed over hard mask layer 22. These additional layers help achieve better patterning quality in the patterning of hard mask layer 22. Next, photo sensitive layer 26 is formed over BARC 24, and is then patterned. Photo sensitive layer 26 may be a photo resist, and hence is referred to as a photo resist hereinafter. In accordance with some embodiments of the present disclosure, edges 26A of patterned photo resist 26 are parallel to each other.

Figure 2:
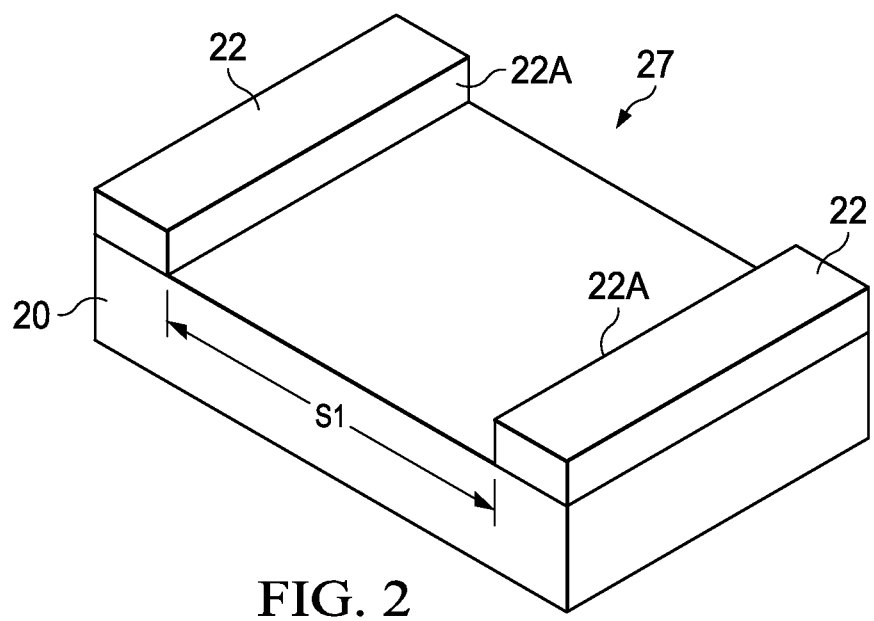

The patterned photo resist 26 is used as an etching mask to etch the underlying BARC 24 and hard mask layer 22. The respective step is shown as step 204 in the process flow shown in FIG. 18. After the etching step, photo resist 26 and BARC 24 are removed, and leaving the patterned hard mask layer 22. The resulting structure is shown in FIG. 2. Through the steps shown in FIGS. 1 and 2, trench 27 is formed in hard mask layer 22. The neighboring remaining portions of hard mask layer 22 have edges 22A exposed to trench 27, wherein neighboring edges 22A are parallel to each other. In accordance with some embodiments, distance S1 between the neighboring edges 22A is in the range from about 100 nm to about 500 nm, and a greater or smaller distance S1 is also contemplated in the present disclosure.

Figure 3:
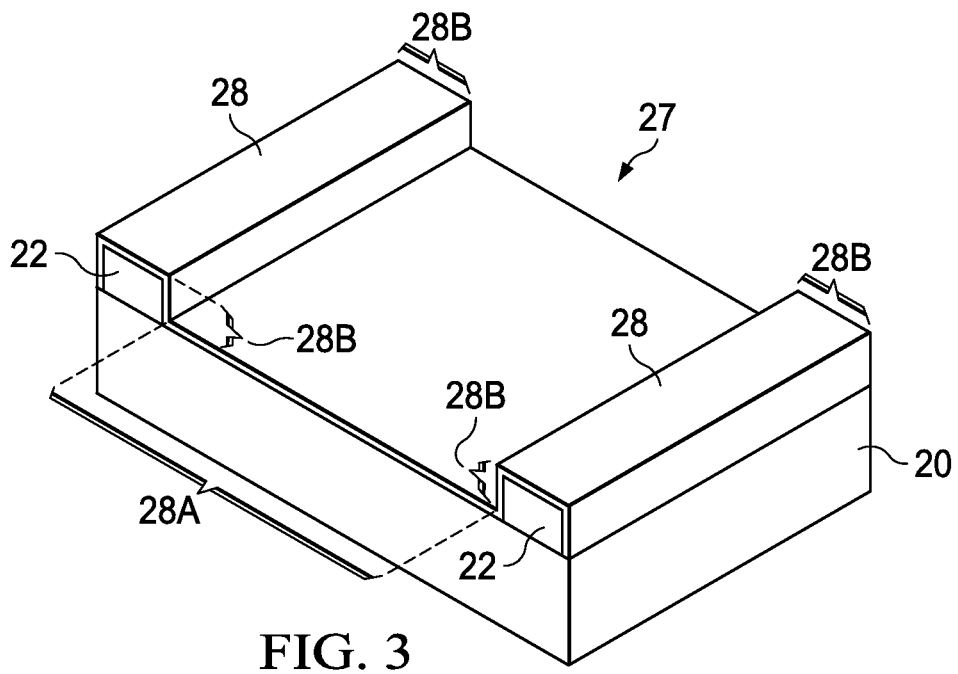
Figure 4:
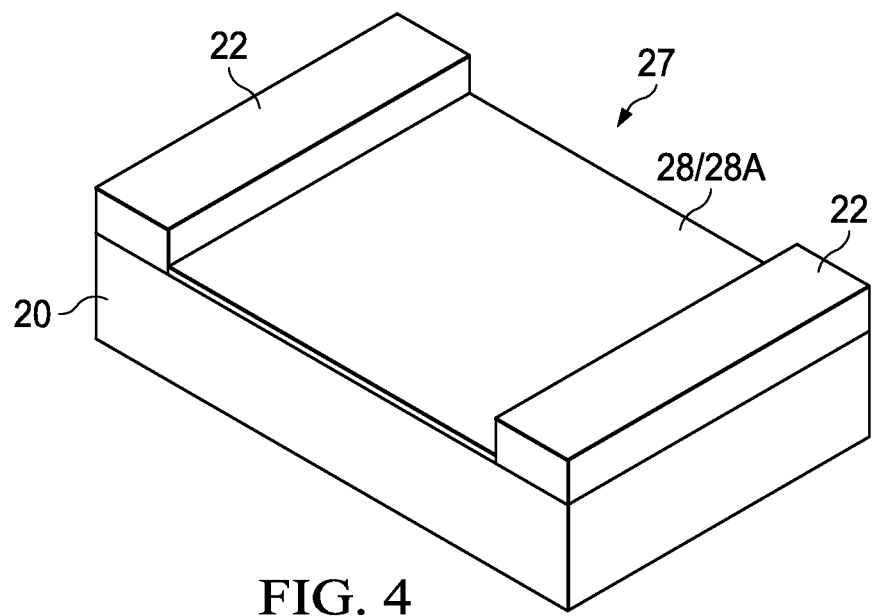

FIGS. 3 and 4 illustrate the formation and the etch-back of neutralized layer 28. The respective step is shown as steps 206 and 208 in the process flow shown in FIG. 18. In FIG. 3, neutralized layer 28 is formed, for example, through spin coating, and hence neutralized layer 28 is filled into trench 27 in hard mask layer 22. Neutralized layer 28 may also comprise first portion 28A at the bottom of trench 27, and second portions 28B on the sidewalls and the top surfaces of hard mask layer 22. In accordance with some embodiments of the present disclosure, neutralized layer 28 comprises polystyrene-random-methyl methacrylate (PS-r-PMMA). In alternative embodiments, silicon oxide ($SiO_2$) may be used to form neutralized layer 28. In the embodiments $SiO_2$ is used to form neutralized layer 28, neutralized layer 28 may be formed as illustrated in FIGS. 3 and 4, or may be formed over target layer 20 before the formation of hard mask layer 22. In the respective embodiments, neutralized layer 28 will comprise a portion exposed through hard mask layer 22, and portions underlying hard mask layer 22 and over target layer 20. Neutralized layer 28 may be a homogenous layer, wherein all parts of neutralized layer 28 are formed of the same material, and there is no material difference from one part to another.

An etch back is performed on neutralized layer 28, so that second portions 28B of neutralized layer 28 are removed, as shown in FIG. 4. The respective step is shown as step 208 in the process flow shown in FIG. 18. In accordance with some embodiments of the present disclosure, for example, when neutralized layer 28 is formed using spin coating, the first portion 28A, which is at the bottom of trench 27, is thicker than second portions 28B (FIG. 3) of neutralized layer 28. Accordingly, after the etch back, some of the first portion 28A of neutralized layer 28 remains at the bottom of trench 27. In alternative embodiments, the etch back step is not performed, and second portions 28B of neutralized layer 28 remain.

In some exemplary embodiments, a neutralization treatment is performed on neutralized layer 28. The neutralization treatment may further improve the neutralization of neutralized layer 28. In alternative embodiments, no neutralization treatment is performed on the neutralized layer 28. The neutralization treatment is performed using process gases that do not react with neutralized layer 28 and hard mask layer 22. The exemplary process gases include, and are not limited to, $C_xF_y$, $O_2$, $N_2$, inert gases such as Ar and He, and combinations thereof, wherein the values of x and y represent the number of atoms of C and F, respectively, in the molecule. The neutralization treatment includes generating plasma from the process gases, and treating neutralized layer 28 using the plasma. The neutralization treatment further improves the property of neutralized layer 28, so that the property is more neutral with relative to PS and PMMA.

Figure 5:
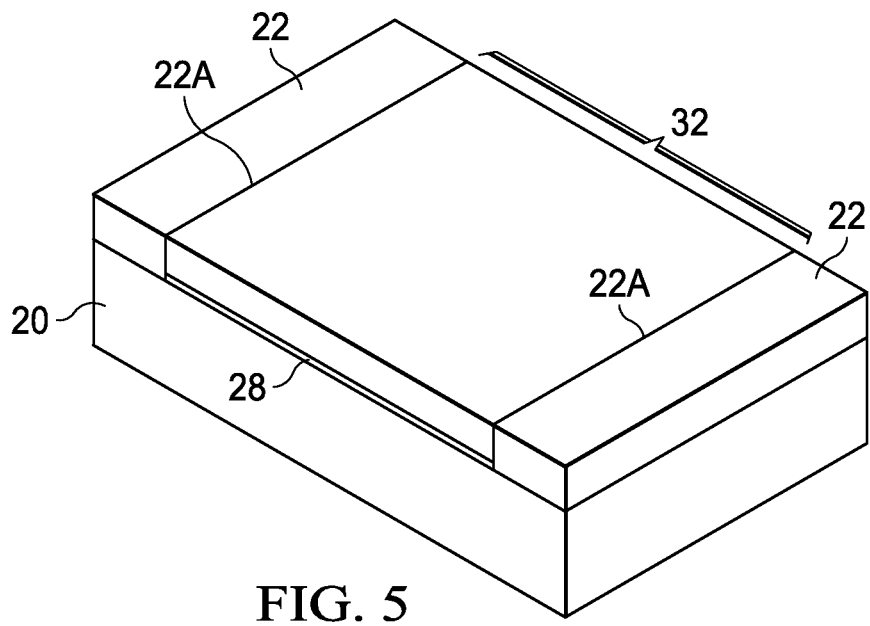
Figure 6:
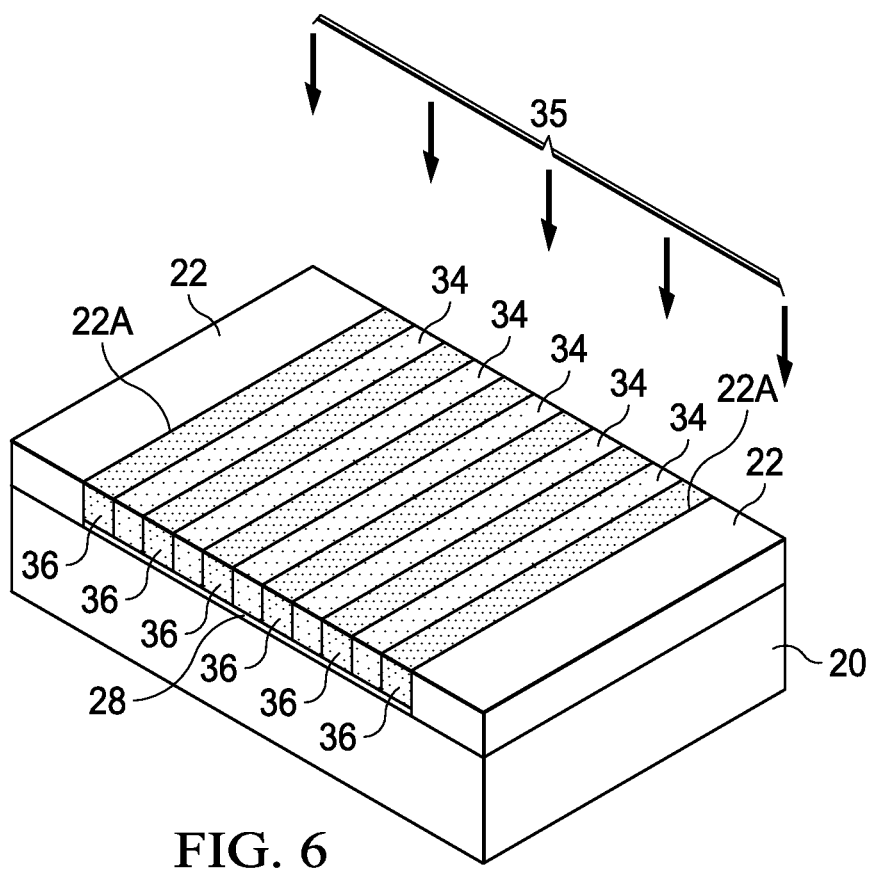
Figure 7:
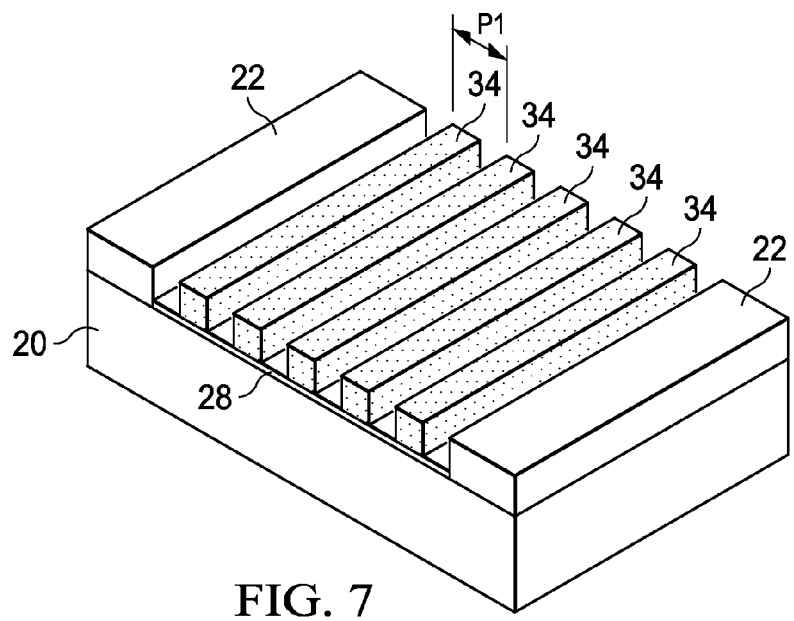

FIGS. 5 through 7 illustrate an exemplary DSA process in accordance with some embodiments of the present disclosure. FIG. 5 illustrates the dispensing of BCP coating 32. The respective step is shown as step 210 in the process flow shown in FIG. 18. In accordance with some embodiments of the present disclosure, BCP coating 32 comprises a mixture of PS and PMMA. BCP coating 32 may be dispensed using spin coating. BCP coating 32 fills trench 27, and is confined by the opposite sidewalls 22A of hard mask layer 22. In accordance with some embodiments of the present disclosure, BCP coating 32 is over and contacts neutralized layer 28. In alternative embodiments, the steps shown in FIGS. 3 and 4 are skipped, and neutralized layer 28 is not formed. Accordingly, BCP coating 32 is over and contacting target layer 20. In yet other embodiments, neutralized layer 28 is formed and not etched back. Accordingly, the bottom surface and the sidewalls of BCP coating 32 are all in contact with neutralized layer 28.

Next, referring to FIG. 6, a phase separation step is performed on BCP coating 32. The respective step is shown as step 212 in the process flow shown in FIG. 18. In accordance with some embodiments, the phase separation of BCP coating 32 causes the two main components in BCP coating 32 to separate from each other. For example, when BCP coating 32 includes PS and PMMA, the phase separation causes the PS to congregate to form PS strips, and PMMA to congregate to form PMMA strips. Furthermore, the PS and PMMA are separated into a plurality of strips that have longitudinal directions parallel to edges 22A of hard mask layer 22. In the illustrated embodiments, the PS strips are marked as 34, and the PMMA strips are marked as 36. PS strips 34 and PMMA strips 36 are located with an alternating layout, with each of PS strips 34 being between and adjoining two of PMMA strips 36, and vice versa. Because neutralized layer 28 comprises polystyrene-random-methyl methacrylate (PS-r-PMMA), neutralized layer 28 will not be separated into PS strips and PMMA strips.

In accordance with some embodiments, the phase separation of BCP coating 32 is achieved by treating the structure in FIG. 5 with a chemical (represented by arrows 35). In accordance with some embodiments, the treating chemical comprises toluene (sometimes known as methylbenzene), which is a water-insoluble liquid. The treating of BCP coating 32 in the chemical may include submerging BCP coating 32 in the chemical, spraying the chemical on BCP coating 32, or the like. In accordance with some exemplary embodiments, the treatment is performed at room temperature (for example, between about 18° C. and about 25° C.). Higher temperatures may also be used to accelerate the phase separation process. The treating time may be in the range between about 1 minute and about 30 minutes.

In accordance with alternative embodiments of the present disclosure, the phase separation of BCP coating 32 is achieved by annealing. The annealing may be performed using a temperature higher than about 25° C. For example, the annealing temperate may be between about 100° C. and about 300° C., with an annealing duration between about 0.5 minutes and about 2 hours.

In accordance with yet other embodiments, the phase separation of BCP coating 32 is achieved by treating BCP coating 32 with a Ultra-Violet (UV) light (also represented by arrows 35). In accordance with some embodiments, the UV light has a wavelength between about 200 nm and about 400 nm, and the treatment time may be between about 10 seconds and about 50 minutes in some exemplary embodiments.

PS strips 34 and PMMA strips 36 may have a high etching selectivity. Accordingly, as shown in FIG. 7, PMMA strips 36 are selectively etched, and PS strips 34 remain. Etching selectivity reflects the ratio of the etching rate of PS strips 34 to the etching rate of PMMA strips 36 (or the ratio of the etching rate of PMMA strips 36 to the etching rate of PS strips 34). If there is no etching selectivity between PS strips 34 and PMMA strips 36 or the etching selectivity is too low, when PMMA strips 36 are etched, PS strips 34 are also undesirably etched. In accordance with some embodiments, PS strips 34 are desired not to be etched, and an etchant that etches PMMA strips 36 but does not etch PS strips 34 substantially is selected. The respective step is shown as step 214 in the process flow shown in FIG. 18. The remaining PS strips 34 are spaced apart from each other by the spacing previously occupied by PMMA strips 36. Pitch P1 of PS strips 34 may be between about 5 nm and about 50 nm, for example. In alternative embodiments (not shown), rather than etching PMMA strips 36, PS strips 34 are etched, and PMMA strips 36 are left after the etching step. The etching of PMMA may be performed through dry etch, wherein oxygen ($O_2$), carbon oxide ($CO_2$), and/or the like are used as etching gases. In addition, some gases such as $C_xF_y$ may be used to protect the profile of the remaining PS strips 34. In alternative embodiments, PMMA is etched through wet etching, for example, using acetic acid (also known as ethanoic acid, with the formula $CH_3COOH$).

Figure 8:
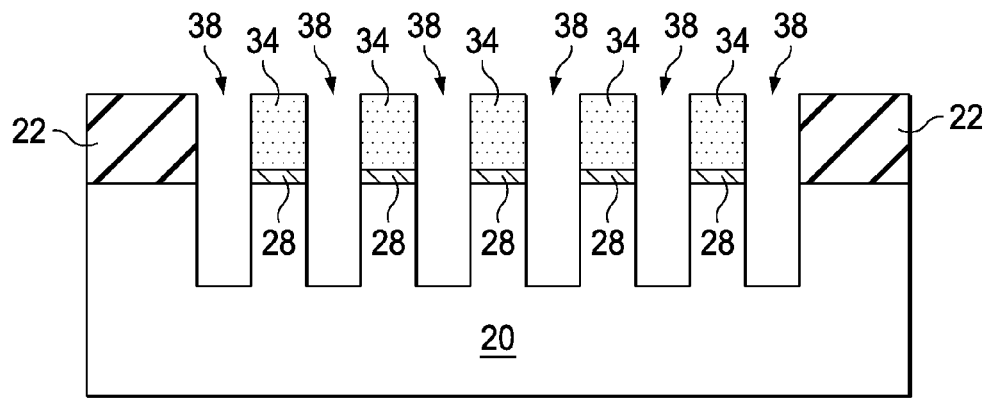
Figure 9:
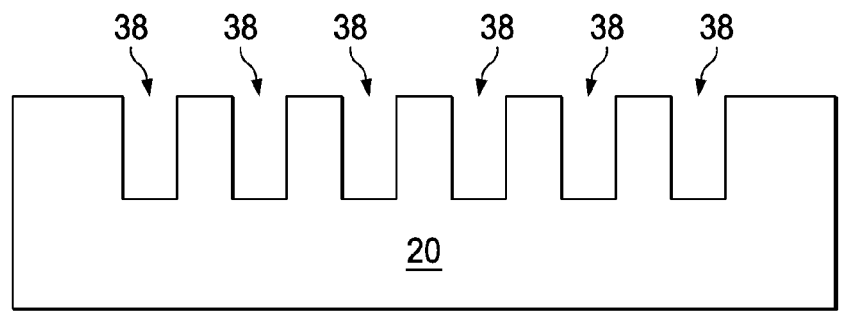

FIG. 8 illustrates the etching of target layer 20, wherein PS strips 34 and hard mask layer 22 in combination act as the etching mask. The respective step is shown as step 216 in the process flow shown in FIG. 18. In the etching step, the portions of target layer 20 that are not covered by PS strips 34 and hard mask layer 22 are etched. The portions of neutralized layer 28 that are exposed through neighboring PS strips 34 are also etched. Openings 38 are formed in target layer 20. In the illustrated embodiments, openings 38 extend to an intermediate level of target layer 20. These embodiments may be used, for example, for forming trenches in semiconductor substrate 20. A dielectric material(s) may be filled into openings 38 to form Shallow Trench Isolation (STI) regions. Due to the close proximity of openings 38 and the small widths of openings 38, the STI regions, which recessed, will result in closely located semiconductor strips which also have small widths. Accordingly, these semiconductor strips are suitable for forming FinFETs. In alternative embodiments, openings 38 penetrate through target layer 20. These embodiments may be used when target layer 20 is a metal layer or a dielectric layer, and hence the remaining portions of target layer 20 may form metal lines or dielectric regions. In FIG. 9, PS strips 34 and neutralized layer 28 (FIG. 8) are removed. The respective step is shown as step 218 in the process flow shown in FIG. 18. Hard mask layer 22 may remain un-removed, or may be removed as shown in FIG. 9.

FIGS. 10 through 17 illustrate cross-sectional views of intermediate stages in a DSA process in accordance with alternative embodiments. These embodiments are similar to the embodiments in FIGS. 1 through 9, except that a neutralization treatment on target layer 20 replaces the formation of neutralized layer 28. Unless specified otherwise, the materials and the formation methods of the components in these embodiments are essentially the same as the respective components having the same reference notations in the embodiments shown in FIGS. 1 through 9. The details regarding the formation process and the materials of the components shown in FIGS. 10 through 17 may thus be found in the discussion of the embodiments shown in FIGS. 1 through 9.

Figure 10:
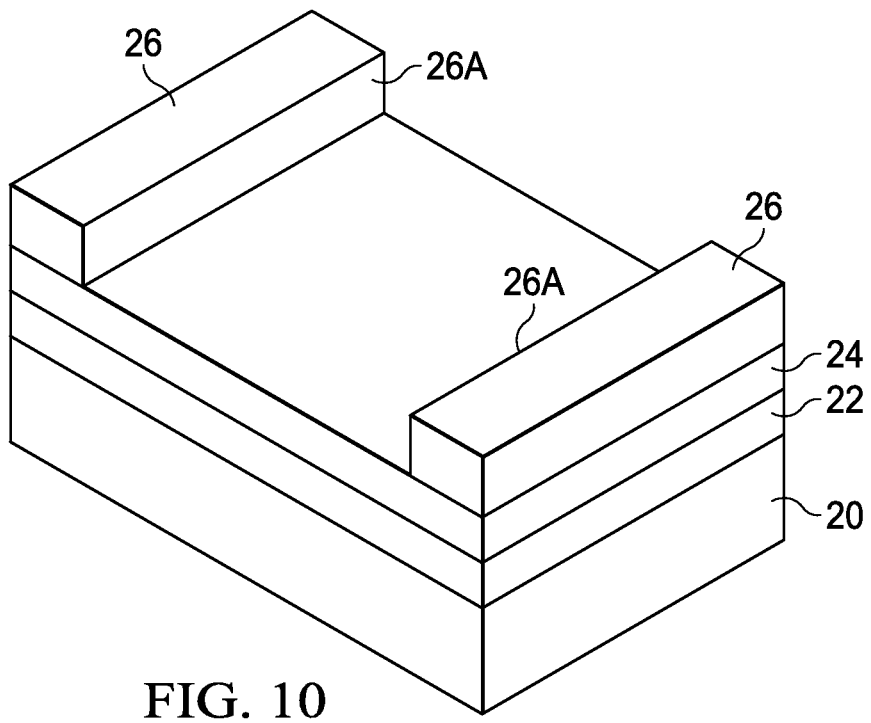
FIGS. 10 through 17 are cross-sectional views of intermediate stages in a DSA process in accordance with some exemplary embodiments.

Referring to FIG. 10, the initial structure for patterning hard mask layer 22 is formed over target layer 20, which is to be patterned in the DSA process in accordance with some embodiments of the present disclosure. The respective step is shown as step 202 in the process flow shown in FIG. 18. The initial structure includes BARC 24 and the patterned photo resist 26 over BARC 24.

Figure 11:
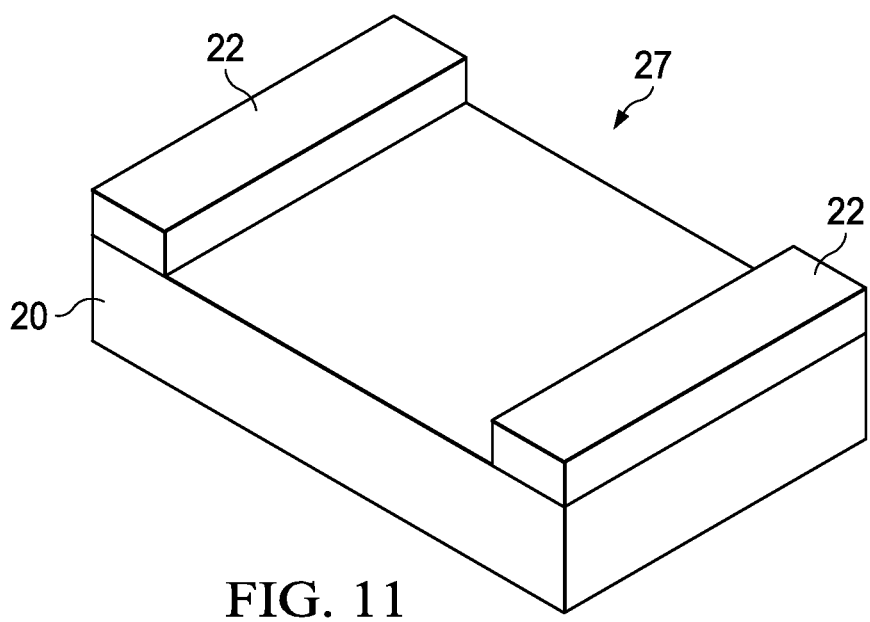

FIG. 11 illustrates the patterning of hard mask layer 22. The respective step is shown as step 204 in the process flow shown in FIG. 18. Also, photo resist 26 and BARC 24 as shown in FIG. 10 are also removed. Hence, the remaining portions of hard mask layer 22 are over target layer 20, with trench 27 formed between the patterned hard mask layer 22. In the resulting structure, the top surface of target layer 20 is exposed to trench 27.

Figure 12:
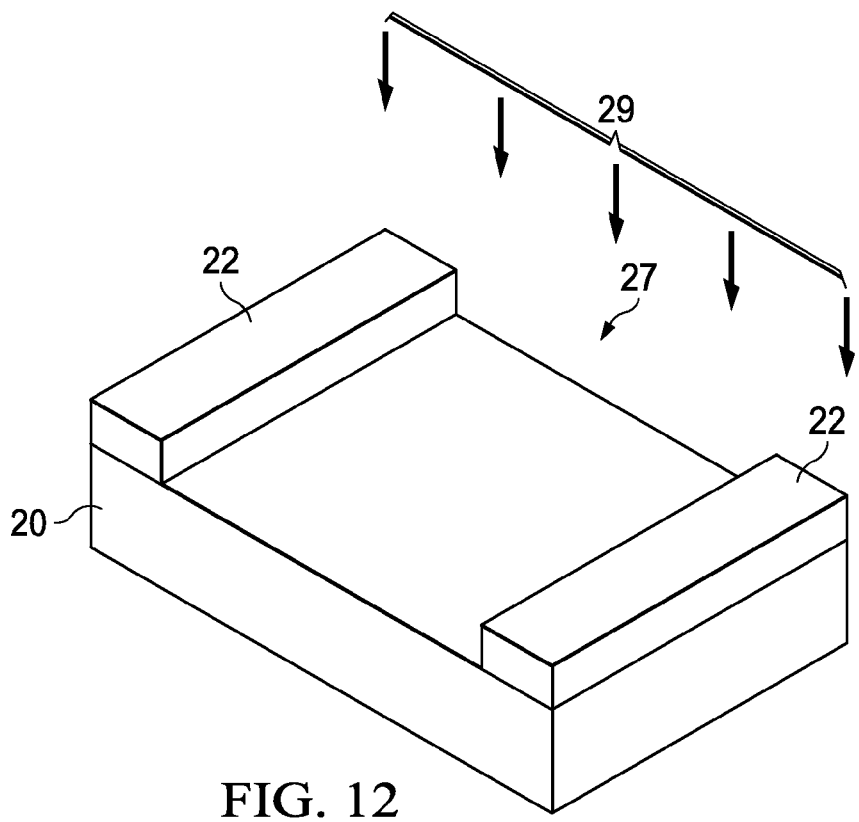
Figure 13:
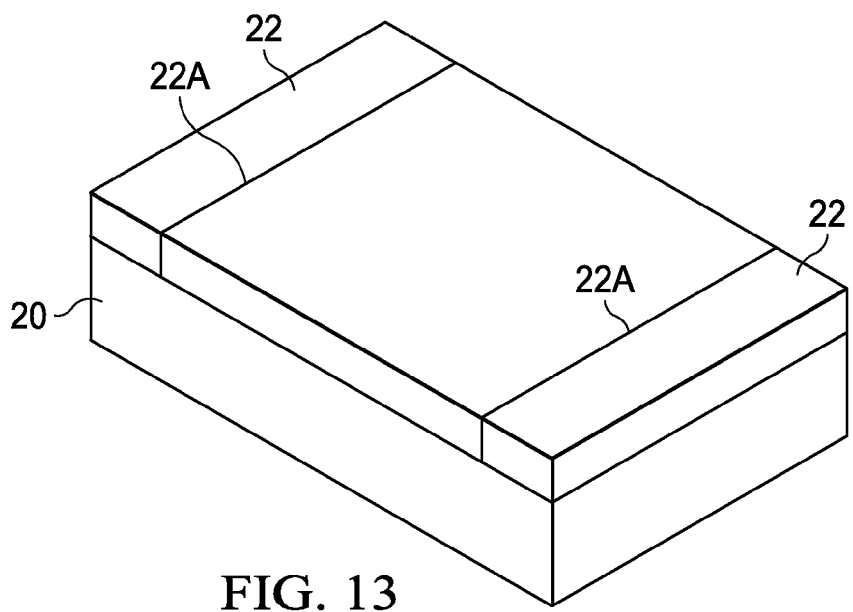

Referring to FIG. 12, a neutralization treatment (represented by arrows 29) is performed on the top surface of target layer 20. The respective step is shown as step 207 in the process flow shown in FIG. 18. The function of the neutralization treatment is to modify the surface property (such as the contact angles) of the top surface of target layer 20, so that it is more toward the middle of the properties of the two main components in the subsequently formed BCP coating 32 (FIG. 13). For example, BCP coating 32 may include PS and PMMA, with each having its own polarization.

In some exemplary embodiments, the neutralization treatment is performed using process gases that do not react with the underlying target layer 20 and hard mask layer 22. The exemplary process gases include, and are not limited to, $C_xF_y$, $O_2$, $N_2$, inert gases such as Ar and He, and combinations thereof. The neutralization treatment includes generating plasma from the process gases, and performing the neutralization treatment with the plasma. The appropriate process gas partially depends on the materials of target layer 20 and hard mask 22. For example, when target layer 20 includes a semiconductor substrate or a metal layer such as a silicon substrate, $C_xF_y$, $N_2$, and/or inert gases may be used in place of $O_2$ to avoid the oxidation from $O_2$. On the other hand, if target layer 20 is a dielectric layer such as an oxide layer, $O_2$ can be used. In addition, other gases such as $C_xF_x$ and/or $N_2$, may also be used as the process gas for the neutralization treatment.

Next, referring to FIG. 13, BCP coating 32 is applied in trench 27 (FIG. 12), for example, through spin coating. The respective step is shown as step 210 in the process flow shown in FIG. 18. BCP coating 32 may also include PS and PMMA in some exemplary embodiments. The bottom surface of BCP coating 32 is in contact with the neutralized top surface of target layer 20 in these embodiments. Furthermore, the sidewalls of BCP coating is also in contact with the sidewalls 22A of hard mask layer 22, which may also be neutralized simultaneously with target layer 20.

Figure 14:
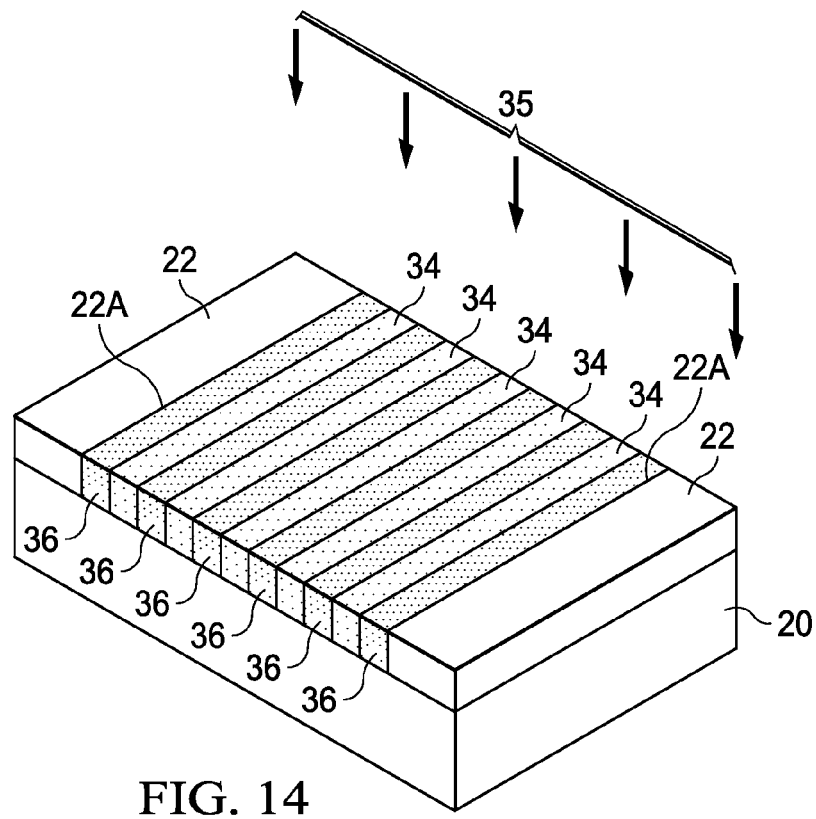

Referring to FIG. 14, a phase separation process is performed on BCP coating 32, so that the two main components in BCP coating 32 are separated. The respective step is shown as step 212 in the process flow shown in FIG. 18. In the embodiments in which BCP coating 32 comprises PS and PMMA, PS strips 34 and PMMA strips 36 are formed as alternating strips having lengthwise directions parallel to the sidewalls 22A of hard mask layer 22. The bottom surfaces of PS strips 34 and PMMA strips 36 are in contact with the treated top surface of target layer 20. The neutralized top surface of target layer 20 helps the phase separation of PS and PMMA without generating distortions in the patterns, and hence PS strips 34 and PMMA strips 36 are more uniform, and the edges of PS strips 34 and PMMA strips 36 are straighter and more vertical.

In accordance with some embodiments, the phase separation process is performed through the treatment of BCP coating 32 using a chemical such as Toluene (represented by arrows 35). In these embodiments, the chemical may be sprayed on BCP coating 32 (FIG. 13). Alternatively, the structure in FIG. 13 including BCP coating 32 may be submerged in the chemical. In accordance with some exemplary embodiments, the treatment is performed at room temperature (for example, between about 18° C. and about 25° C.). Higher temperatures may also be used to accelerate the phase separation process. The treatment time may be in the range between about 1 minute and about 30 minutes.

In alternative embodiments, the phase separation process is performed through thermal anneal, wherein the duration of the thermal anneal may be between about 1 minute and about 30 minutes. The temperature of the thermal anneal may be higher than about 25° C. For example, the annealing temperate may be between about 100° C. and about 300° C., with an annealing duration between about 0.5 minutes and about 2 hours.

In accordance with some embodiments, the phase separation of BCP coating 32 is achieved by treating BCP coating 32 with a UV light (also represented by arrows 35). In accordance with some embodiments, the UV light has a wavelength between about 200 nm and about 400 nm, and the treatment time may be between about 10 seconds and about 50 minutes in some exemplary embodiments.

Figure 15:
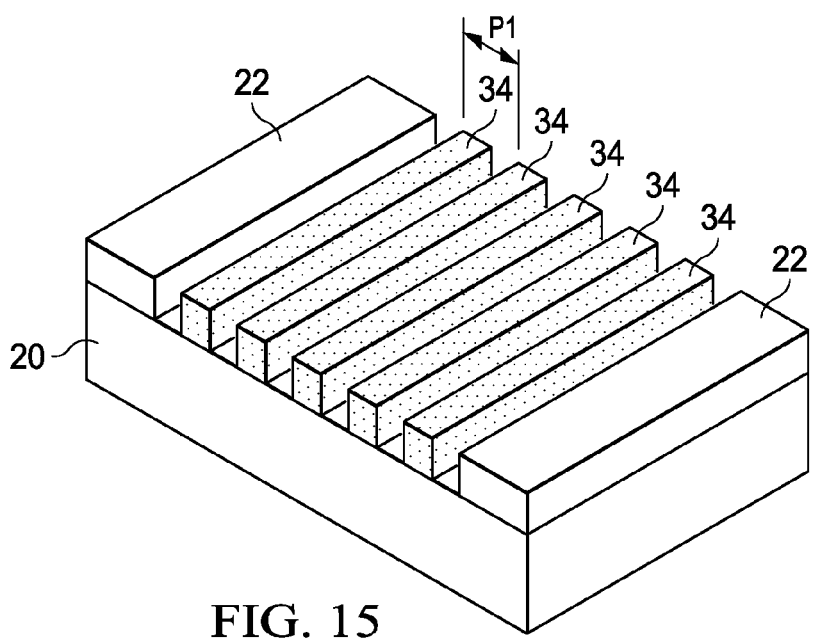

Next, as shown in FIG. 15, either PS strips 34 or PMMA strips 36 are etched. The respective step is shown as step 214 in the process flow shown in FIG. 18. As shown in the exemplary embodiments in FIG. 15, PMMA strips 36 are etched, and PS strips 34 remain. The resulting PS strips 34 are straight strips separated by spaces. Furthermore, the spacing between PS strips 34 may be substantially uniform with uniform pitch P1. In alternative embodiments (not shown), rather than etching PMMA strips 36, PS strips 34 are etched, and PMMA strips 36 are left after the etching step. The etching of PMMA is performed through dry etch or wet etch, wherein the etchants may be found referring to the discussion of the embodiments in FIG. 7.

Figure 16:
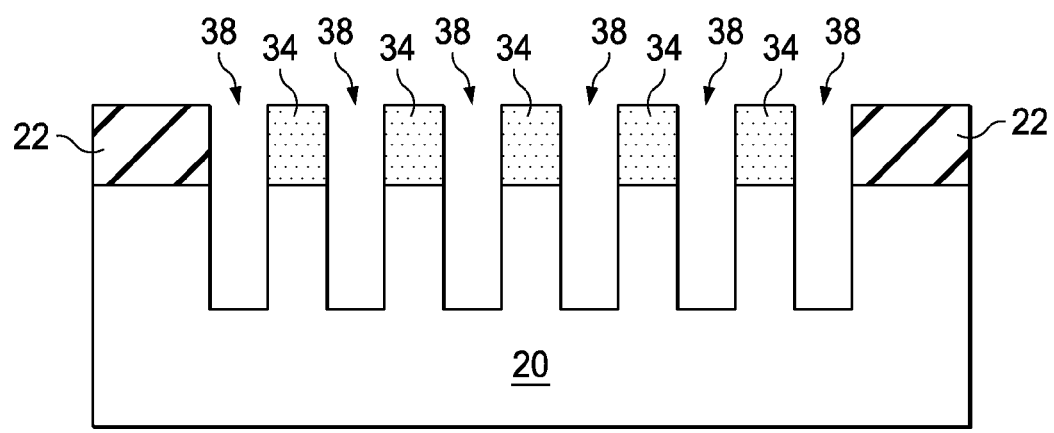
Figure 17:
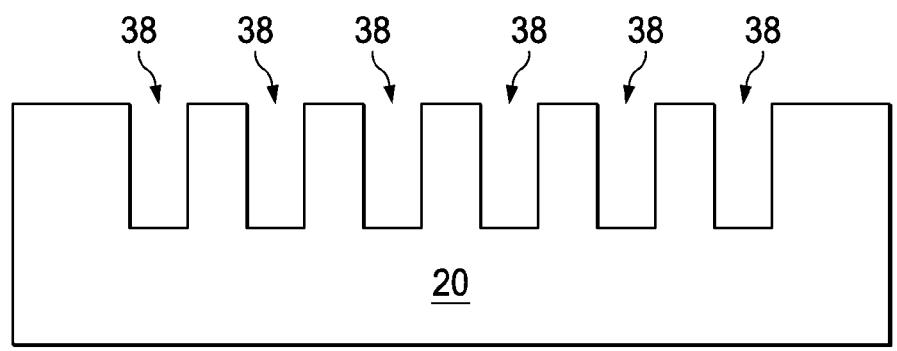

FIG. 16 illustrates the etching of target layer 20, wherein PS strips 34 and hard mask layer 22 in combination act as the etching mask. The respective step is shown as step 216 in the process flow shown in FIG. 18. As a result of the etching, openings 38 are formed in target layer 20. Next, hard mask layer 22 (FIG. 16) is removed, resulting in the structure in FIG. 17. The respective step is shown as step 218 in the process flow shown in FIG. 18.

The embodiments of the present disclosure have some advantageous features. In the conventional DSA process, a photo resist is used to confine the respective BCP coating in order to guide the direction of the separated PS and PMMA during the annealing step. In the annealing of the BCP coating, however, the photo resist is adversely affected by the high temperature adopted in the annealing step. For example, under the high temperature of the annealing step, the photo resist may have a footing problem. Furthermore, due to the high temperature of the annealing, the pitch of PS strips 34 is limited due to the adverse profile of the photo resist. In the embodiments, however, hard mask layer 22 is used to guide the direction of the PS-PMMA strips. Since hard mask layer 22 is not affected by the high temperature of the annealing step, the adverse effect caused by the annealing of the BCP coating is substantially eliminated.

In accordance with some embodiments of the present disclosure, a method includes forming a patterned hard mask layer, with a trench formed in the patterned hard mask layer, dispensing a Bulk Co-Polymer (BCP) coating in the trench, wherein the BCP coating comprises a mix of a first material and a second material different from the first material. The method further includes treating the BCP coating with a chemical to form a first plurality of strips of the first material and a second plurality of strips of the second material, with the first plurality of strips and the second plurality of strips allocated in an alternating layout. The second plurality of strips is selectively etched, and the first plurality of strips is left in the trench.

In accordance with alternative embodiments of the present disclosure, a method includes forming a hard mask layer, forming and patterning a photo resist over the hard mask layer, patterning the hard mask layer to form a trench in the hard mask layer using the photo resist as an etching mask, removing the photo resist, dispensing a BCP coating in the trench, wherein the BCP coating includes PS and PMMA, and exposing the BCP coating to a chemical to form a plurality of PS strips and a plurality of PMMA strips out of the BCP coating, with the plurality of PS strips and the plurality of PMMA strips located alternatingly. The subsequent steps includes selectively etching either the PS strips or the PMMA strips, leaving the other strips remained, and using the remained strips and the hard mask layer as an etching mask to etch a layer underlying the remained strips and the hard mask layer.

In accordance with yet alternative embodiments of the present disclosure, a method includes forming a non-photo-sensitive layer over a target layer, patterning the non-photo-sensitive layer to form a trench, performing a plasma treatment on the target layer, and dispensing a BCP coating into the trench, wherein the BCP coating is over and in contact with a top surface of the target layer. The method further includes performing a phase separation on the BCP coating to separate the BCP coating into a first and a second plurality of strips, wherein the first and the second plurality of strips have different compositions, and are located in an alternating layout. The subsequent steps includes selectively etching the first plurality of strips, with the second plurality of strips left in the trench, etching the target layer using the second plurality of strips and the non-photo-sensitive layer as an etching mask, and removing the second plurality of strips and the non-photo-sensitive layer after the target layer is etched.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a patterned hard mask layer, with a trench formed in the patterned hard mask layer;
   forming a neutralized layer in the trench, the neutralized layer being homogeneous;
   dispensing a Bulk Co-Polymer (BCP) coating in the trench, wherein the BCP coating comprises a mix of a first material and a second material different from the first material, and wherein the BCP coating is dispensed over the neutralized layer;
   treating the BCP coating with a chemical to form a first plurality of strips of the first material and a second plurality of strips of the second material, with the first plurality of strips and the second plurality of strips allocated in an alternating layout, the neutralized layer remaining homogeneous after treating the BCP coating with the chemical; and
   selectively etching the second plurality of strips, with the first plurality of strips left in the trench.

2. The method of claim 1 further comprising using the first plurality of strips and the patterned hard mask layer in combination as an etching mask to etch a layer underlying the first plurality of strips and the patterned hard mask layer.

3. The method of claim 1, wherein the first material comprises Polystyrene (PS), and the second material comprises Polymethyl Methacrylate (PMMA).

4. The method of claim 1, wherein the treating the BCP coating with the chemical comprises treating the BCP coating with toluene.

5. The method of claim 1, wherein the neutralized layer comprises a first portion at a bottom of the trench, and second portions on sidewalls and top surfaces of the hard mask layer, and wherein the method further comprises, before the dispensing the BCP coating, removing the second portions of the neutralized layer.

6. The method of claim 1, wherein after the selectively etching the second plurality of strips, top surfaces of portions of the neutralized layer covered by the second plurality of strips are exposed.

7. The method of claim 1 further comprising performing a neutralization treatment on the neutralized layer.

8. A method comprising:
   forming a hard mask layer;
   forming and patterning a photo resist over the hard mask layer;
   patterning the hard mask layer to form a trench in the hard mask layer using the photo resist as an etching mask;
   removing the photo resist;
   after removing the photo resist, performing a plasma treatment in the trench, wherein the plasma treatment does not etch sidewalls of the trench;
   dispensing a Bulk Co-Polymer (BCP) coating in the trench, wherein the BCP coating comprises Polystyrene (PS) and Polymethyl Methacrylate (PMMA);
   exposing the BCP coating to an ultra-violet (UV) light to form a plurality of PS strips and a plurality of PMMA strips out of the BCP coating, with the plurality of PS strips and the plurality of PMMA strips located alternatingly;
   selectively etching either the PS strips or the PMMA strips, leaving other strips remained; and
   using the remained strips and the hard mask layer as an etching mask to etch a layer underlying the remained strips and the hard mask layer.

9. The method of claim 8 further comprising, after the layer underlying the remained strips and the hard mask layer are etched, removing the remained strips and the hard mask layer.

10. The method of claim 8 further comprising forming a neutralized layer at a bottom of the trench, with the BCP coating over and contacting the neutralized layer.

11. The method of claim 10, wherein the hard mask layer comprises sidewalls in the trench, and the neutralized layer comprises a portion at a bottom of the trench, with the BCP coating in physical contact with lower portions of the sidewalls of the hard mask layer, and with upper portions of the sidewalls of the hard mask layer being exposed to the trench.

12. The method of claim 10, wherein the neutralized layer comprises a first portion at a bottom of the trench, and second portions on sidewalls and top surfaces of the hard mask layer, and wherein the method further comprises, before the BCP coating is dispensed, removing the second portions of the neutralized layer.

13. The method of claim 10, wherein the neutralized layer is formed of a homogenous material.

14. A method comprising:
   forming a non-photo-sensitive layer over a target layer;
   patterning the non-photo-sensitive layer to form a trench;
   after patterning the non-photo-sensitive layer, performing a plasma treatment on the target layer, wherein the plasma treatment does not etch the non-photo-sensitive layer;
   dispensing a Bulk Co-Polymer (BCP) coating into the trench, wherein the BCP coating is over and in contact with a top surface of the target layer;
   performing a phase separation on the BCP coating to separate the BCP coating into a first and a second plurality of strips, wherein the first and the second plurality of strips have different compositions, and are located in an alternating layout;
   selectively etching the first plurality of strips, with the second plurality of strips left in the trench;
   etching the target layer using the second plurality of strips and the non-photo-sensitive layer as an etching mask; and
   after the target layer is etched, removing the second plurality of strips and the non-photo-sensitive layer.

15. The method of claim 14, wherein the phase separation comprises treating the BCP coating with a chemical.

16. The method of claim 14, wherein the plasma treatment on the target layer is performed at room temperature.

17. The method of claim 14, wherein the plasma treatment is performed using a process gas selected from $C_xF_y$, $O_2$, $N_2$, an inert gas, and combinations thereof.

18. The method of claim 7, wherein performing the neutralization treatment on the neutralized layer comprises performing a plasma treatment on the neutralized layer.

19. The method of claim 8, wherein the UV light has a wavelength between about 200 nm and about 400 nm.

20. The method of claim 14, wherein performing the phase separation comprises treating the BCP coating with an ultraviolet (UV) light.

* * * * *